United States Patent
Song et al.

(10) Patent No.: US 11,892,472 B2
(45) Date of Patent: Feb. 6, 2024

(54) TEST DEVICE

(71) Applicant: LEENO INDUSTRIAL INC., Busan (KR)

(72) Inventors: Chang-hyun Song, Busan (KR); Jae-hwan Jeong, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 108 days.

(21) Appl. No.: 17/437,677

(22) PCT Filed: Apr. 17, 2020

(86) PCT No.: PCT/KR2020/005149
§ 371 (c)(1),
(2) Date: Sep. 9, 2021

(87) PCT Pub. No.: WO2020/218779
PCT Pub. Date: Oct. 29, 2020

(65) Prior Publication Data
US 2022/0155341 A1    May 19, 2022

(30) Foreign Application Priority Data
Apr. 22, 2019  (KR) .................. 10-2019-0046788

(51) Int. Cl.
*G01R 1/04*     (2006.01)
*G01R 1/067*    (2006.01)
(Continued)

(52) U.S. Cl.
CPC ............. *G01R 1/045* (2013.01); *G01R 1/073* (2013.01)

(58) Field of Classification Search
CPC .......... G01R 1/02; G01R 1/04; G01R 1/0416; G01R 1/045; G01R 1/067; G01R 1/073;
(Continued)

(56) References Cited

U.S. PATENT DOCUMENTS

| 7,057,410 B1 * | 6/2006 | Wohlfarth | G01R 31/2889 |
| | | | 324/750.25 |
| 2006/0290364 A1 * | 12/2006 | DeLessert | H01R 12/714 |
| | | | 324/755.05 |
| 2020/0341053 A1 * | 10/2020 | Lee | G01R 31/2889 |

FOREIGN PATENT DOCUMENTS

| JP | 05-072269 A | 3/1993 |
| JP | 05-066574 U | 9/1993 |

(Continued)

OTHER PUBLICATIONS

International Search Report for PCT/KR2020/005149 dated Aug. 18, 2020 [PCT/ISA/210].
(Continued)

*Primary Examiner* — Neel D Shah
(74) *Attorney, Agent, or Firm* — Sughrue Mion, PLLC

(57) ABSTRACT

Disclosed is a test device for testing an electric characteristic of an object to be tested. The test device includes a block comprising a probe hole, a probe supported in the probe hole and retractably configured to connect a first contact point and a second contact point, and a coaxial cable comprising an insulated sheath, a main core surrounded with the insulated sheath, and a probe contact portion exposed from the insulated sheath and extended from the main core so as to be in contact with the probe. An axis of the probe is spaced apart from an axis of the coaxial cable, and the probe contact portion is extended from the main core toward the axis of the probe.

16 Claims, 12 Drawing Sheets

(51) Int. Cl.
*G01R 1/073* (2006.01)
*G01R 31/26* (2020.01)
*G01R 31/28* (2006.01)
*H01L 21/66* (2006.01)
*H01L 23/58* (2006.01)
*H01L 29/10* (2006.01)

(58) Field of Classification Search
CPC ........ G01R 31/02; G01R 31/26; G01R 31/28; G01R 31/70; H01L 21/66; H01L 23/58; H01L 29/10
See application file for complete search history.

(56) References Cited

FOREIGN PATENT DOCUMENTS

| | | |
|---|---|---|
| JP | 05-069684 U | 9/1993 |
| JP | 07-099220 A | 4/1995 |
| JP | 10-339743 A | 12/1998 |
| JP | 2003-270291 A | 9/2003 |
| JP | 2003-307552 A | 10/2003 |
| JP | 2006-343334 A | 12/2006 |
| JP | 2007-322420 A | 12/2007 |
| JP | 2008-544250 A | 12/2008 |
| JP | 2012-520992 A | 9/2012 |
| KR | 10-2001-0112654 A | 12/2001 |
| KR | 10-2004-0005828 A | 1/2004 |
| KR | 10-2004-0044377 A | 5/2004 |
| KR | 10-2008-0015326 A | 2/2008 |
| TW | 2017-034469 A | 10/2017 |
| WO | 2009/098770 A1 | 8/2009 |

OTHER PUBLICATIONS

Written Opinion for PCT/KR2020/005149 dated Aug. 18, 2020 [PCT/ISA/237].
Communication from Korean Intellectual Property Office for 10-2019-0046788 dated Mar. 17, 2020.
Communication from Korean Intellectual Property Office for 10-2019-0046788 dated Jul. 28, 2020.
Communication from Taiwanese Intellectual Property Office for 108117589 dated Oct. 28, 2020.
Communication from Taiwanese Intellectual Property Office for 108117589 dated Jun. 22, 2021.
Extended European Search Report dated Feb. 23, 2022 in European Application No. 20794276.4.

\* cited by examiner

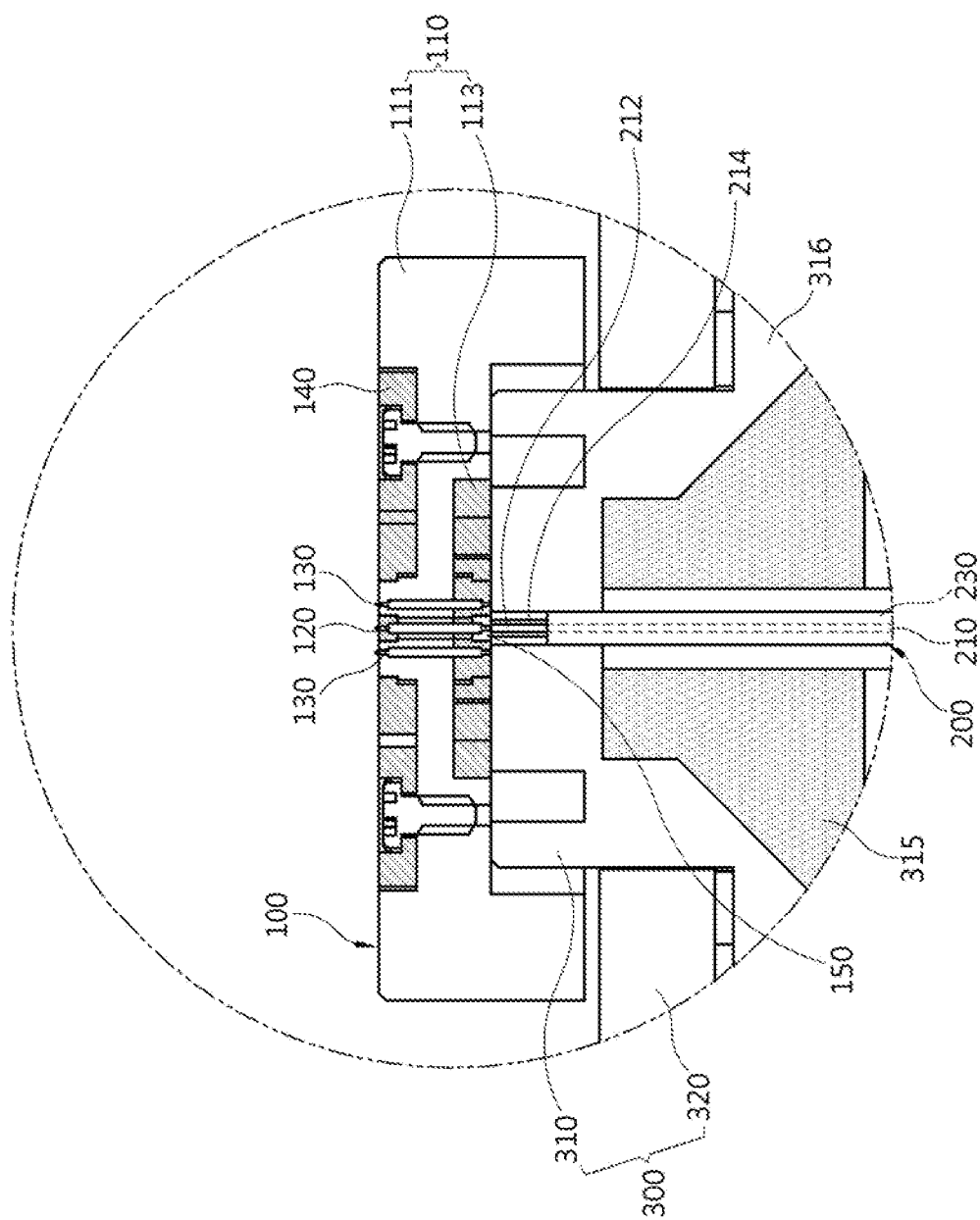
[Figure 5]

[Figure 6]
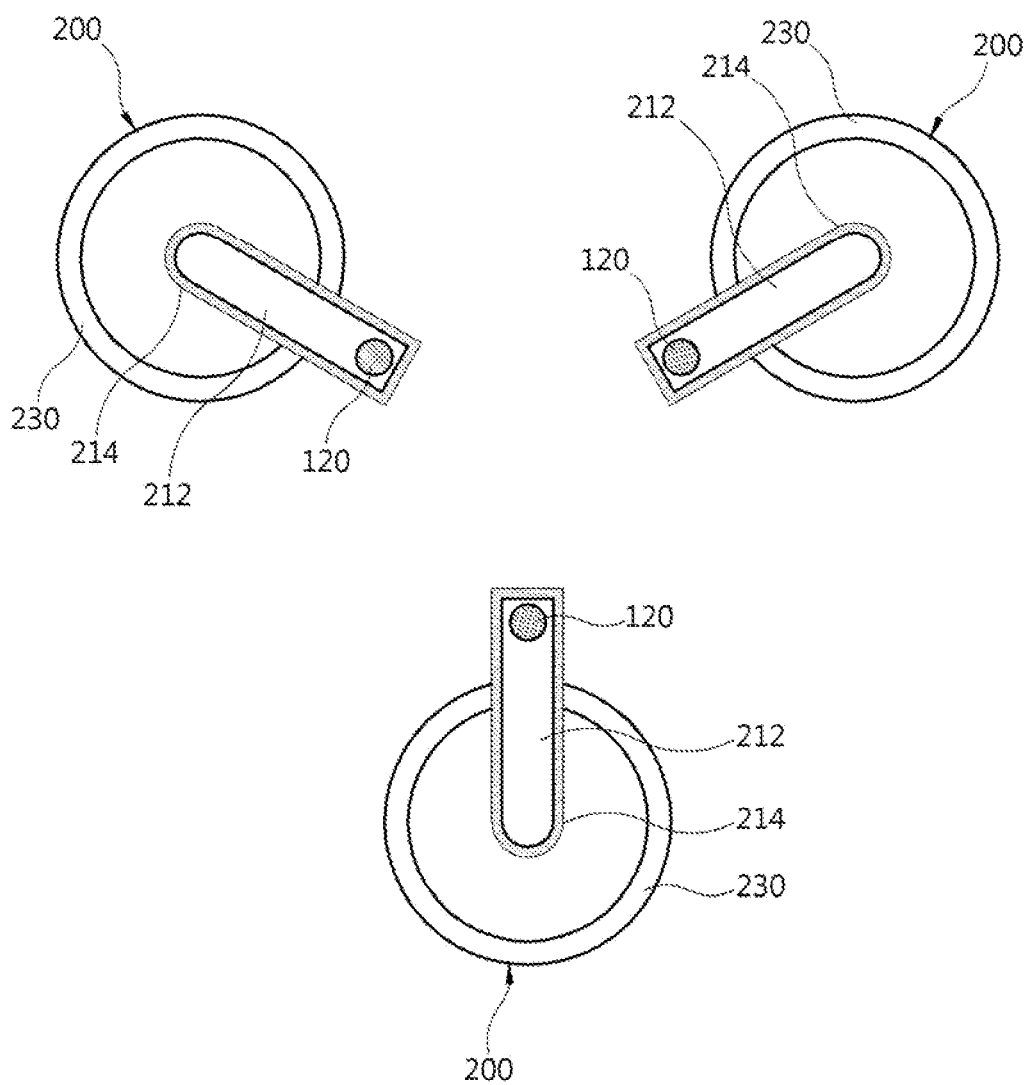

[Figure 7]
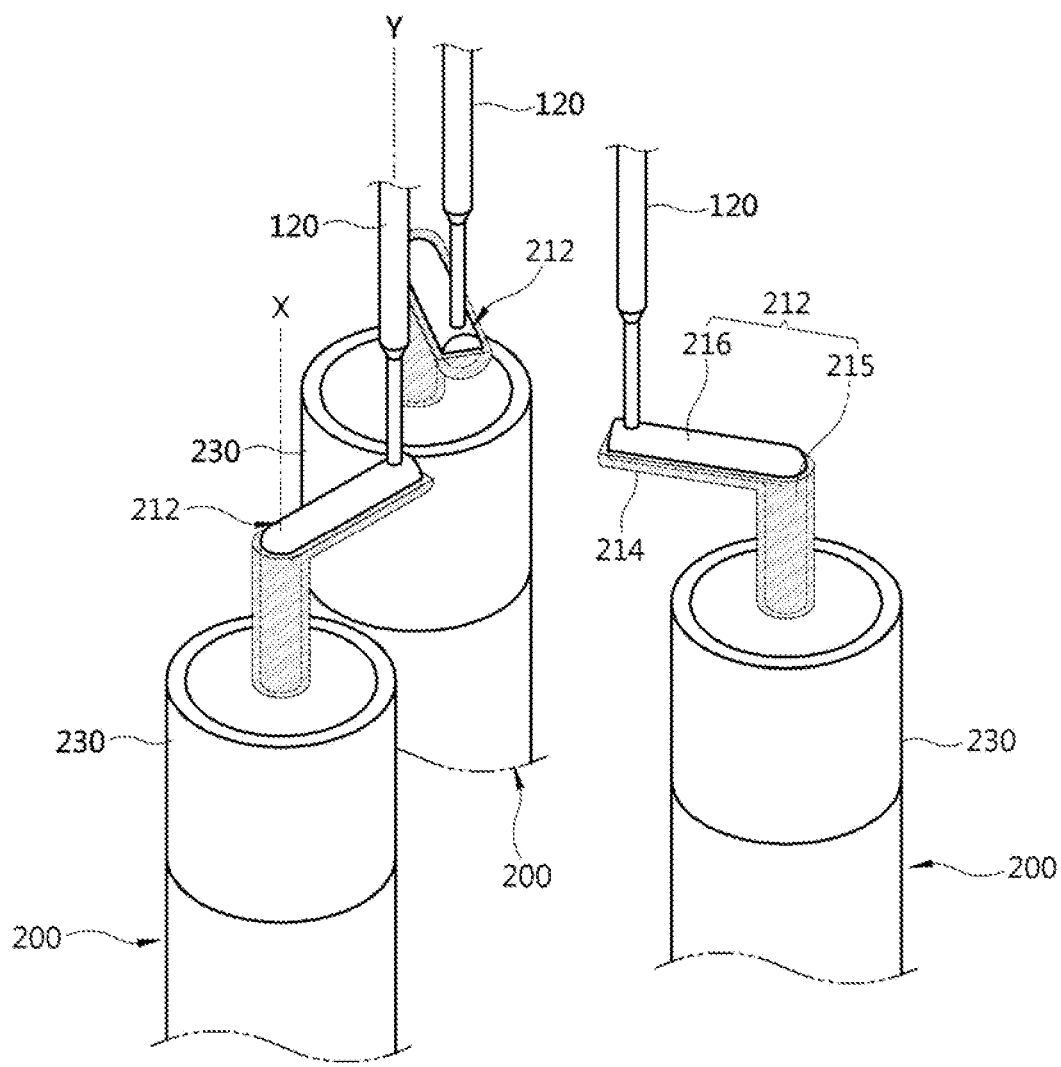

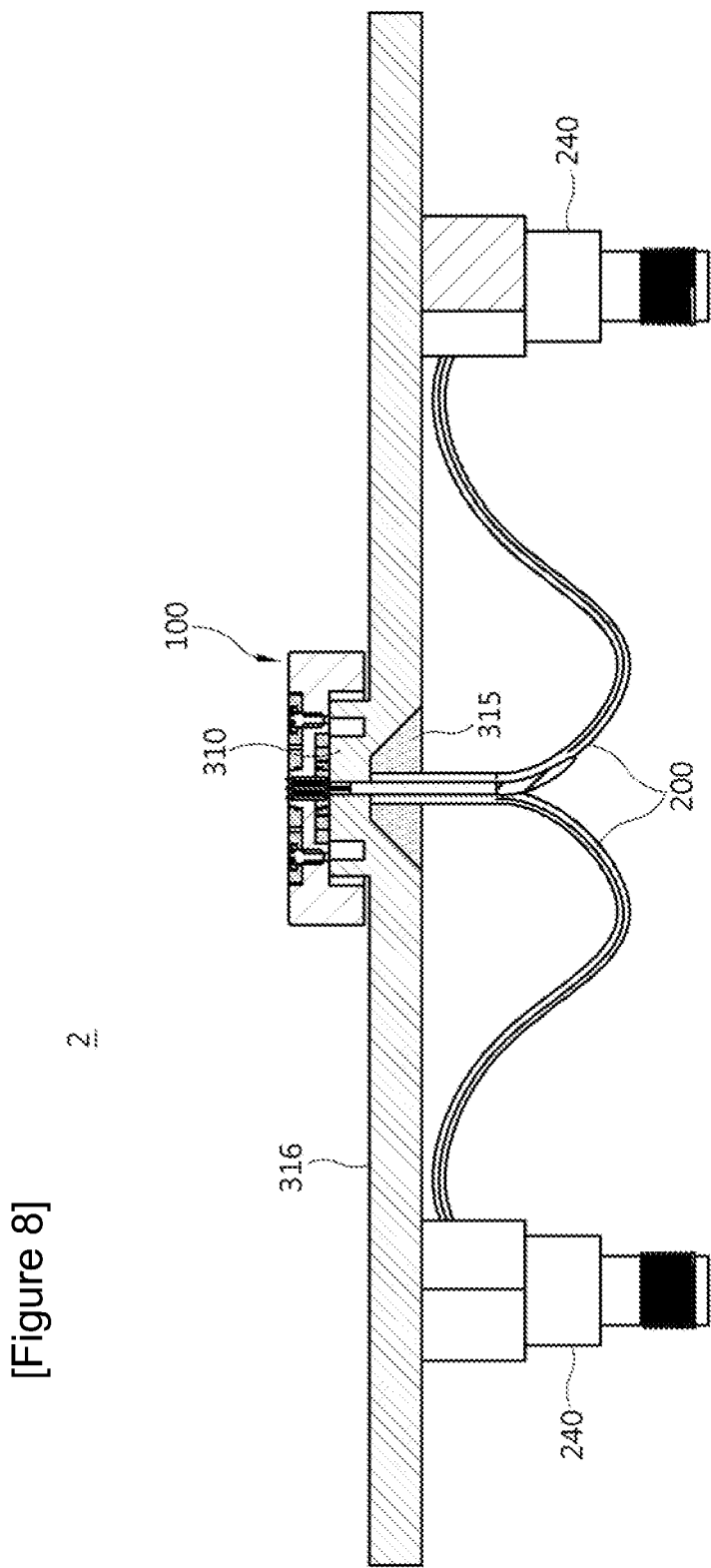
[Figure 8]

[Figure 9]
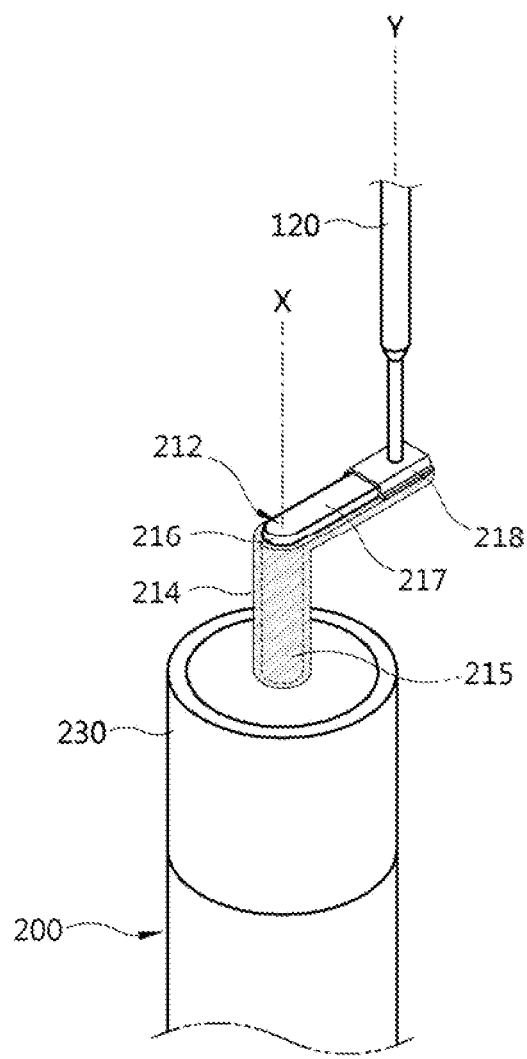

【Figure 10】
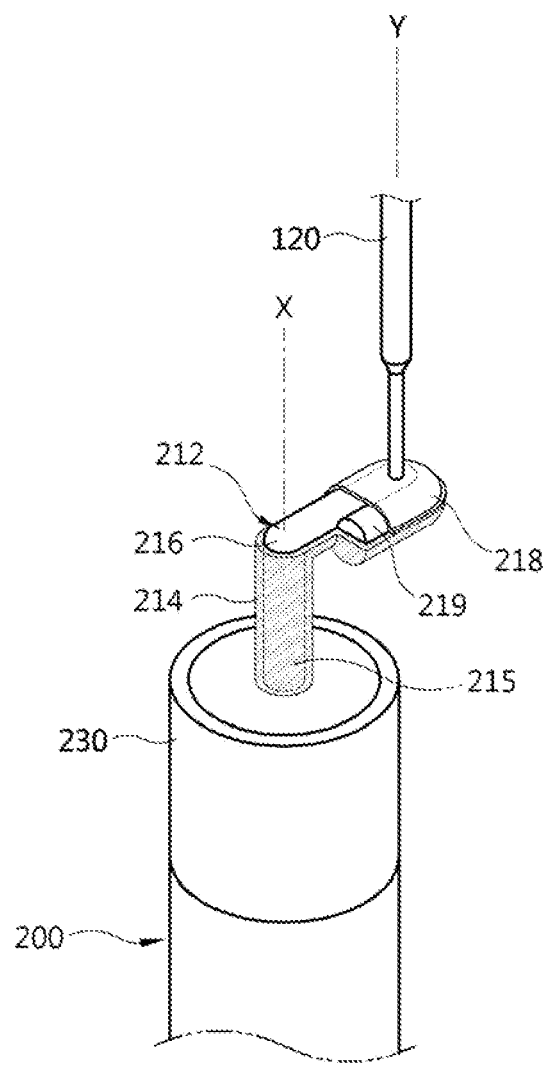

【Figure 11】
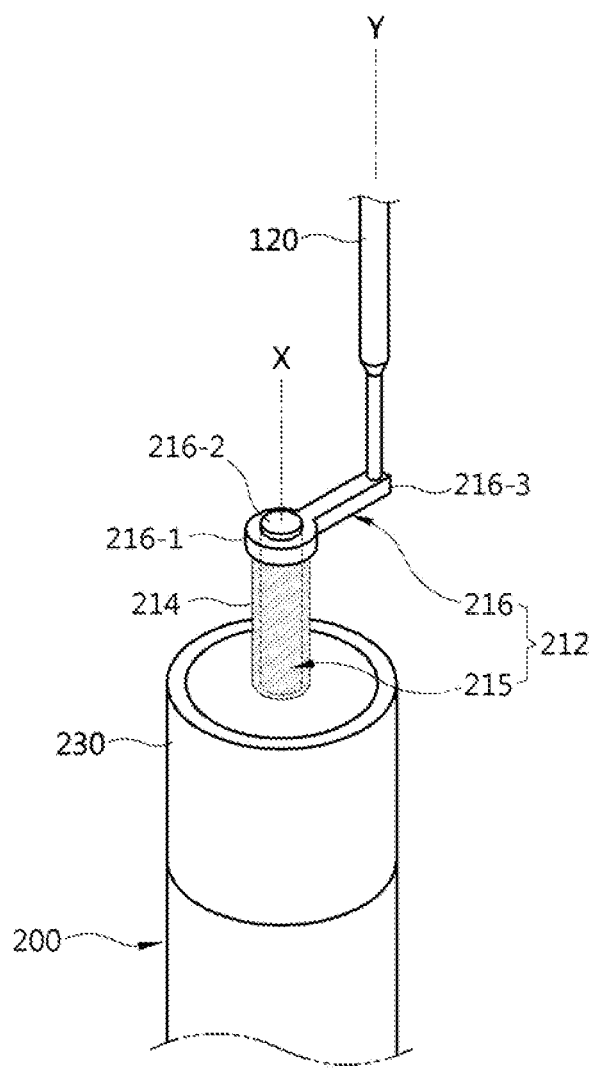

[Figure 12]
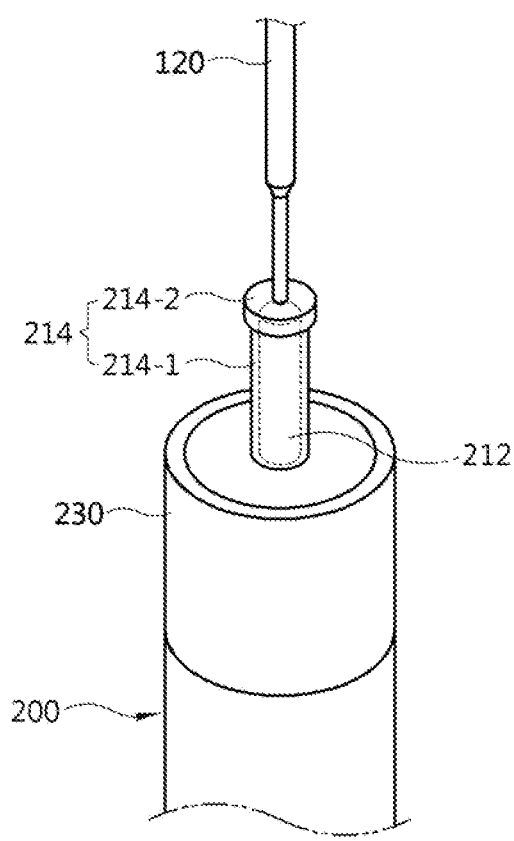

TEST DEVICE

CROSS REFERENCE TO RELATED APPLICATIONS

This application is a National Stage of International Application No. PCT/KR2020/005149 filed Apr. 17, 2020, claiming priority based on Korean Patent Application No. 10-2019-0046788 filed Apr. 22, 2019 at the Korea Intellectual Property Office, the entireties of which are incorporated by reference.

TECHNICAL FIELD

The present disclosure relates to a test device for a high-speed and high-frequency test, which effectively blocks noise from an adjacent signal line and is improved in a characteristic of signal transmission.

BACKGROUND ART

To test electric characteristics of a device to be tested such as a semiconductor, a test device has employed a probe socket to support a test probe, and a test circuit board to apply a test signal to the test probe as being in contact with the test probe. As a high-frequency and high-speed semiconductor is decreased in pitch and increased in allowable current, a noise shield has become very important between signal probes of the probe socket. In other words, the mechanical length, impedance matching, etc. of the test circuit board have become important as the test speed and frequency are gradually increased.

A conventional test device includes a probe socket for supporting signal probes, and a test circuit board placed under the probe socket and providing a test signal. In the probe socket, the signal probe performs a test as being contactless-inserted in a conductive brass block. Further, the test circuit board includes a conductive column and a signal pad which are formed on an insulating dielectric substrate and transmit the test signal. When the high-frequency and high-speed semiconductor and the like object required to have high isolation is subjected to the test, a conductive ground body has been used as a shield between the adjacent signal probes of the probe socket. However, to make the test more reliable, there is a need of maintenance to minimize an isolation loss caused by noise between the signal pads and the conductive columns of the test circuit board. Further, the test circuit board includes a signal line having a predetermined length, and therefore a signal loss is caused by the length of the signal line, thereby deteriorating a characteristic of signal transmission.

The present applicant has disclosed the test device, in which the signal probe and the core of the coaxial cable are in direct contact with each other, in Korean Patent Application No. 2017-0162775. In this case, the core is exposed from the coaxial cable is in contact with the end of the signal probe, and therefore the core may be bent or lowered in contact reliability. In addition, the coaxial cable has a large diameter due to insulated sheath, and therefore it may be different to make direct contact between the core and the signal probe when a pitch between contact points of an object to be tested is small.

DISCLOSURE

Technical Problem

An aspect of the present disclosure is conceived to solve the conventional problems, and provides a test device which can test an object having a fine pitch between contact points by making a signal probe be in direct contact with a core of a coaxial cable.

Another aspect of the present disclosure provides a test device improved in contact reliability of a test based on direct contact between a signal probe and a core of a coaxial cable.

Technical Solution

In accordance with a first aspect of the present disclosure, there is provided a test device for testing an electric characteristic of an object to be tested. The test device includes: a block including a probe hole; a plurality of signal probes supported in the probe hole and retractably configured to connect a contact point of the object to be tested and a signal contact point for applying a test signal; a coaxial cable including an insulated sheath, a main core surrounded with the insulated sheath, and a probe contact portion exposed from the insulated sheath and extended from the main core so as to be in contact with the signal probe, wherein an axis of the signal probe is spaced apart from an axis of the coaxial cable, and the probe contact portion includes a linear extension portion exposed from the insulated sheath and extended along an axis of the coaxial cable, and a contact portion extended from the linear extension portion toward an axis of the probe.

In accordance with a second aspect of the present disclosure, there is provided a test device for testing an electric characteristic of an object to be tested. The test device includes: a block including a probe hole; a plurality of signal probes supported in the probe hole and retractably configured to connect a contact point of the object to be tested and a signal contact point for applying a test signal; a coaxial cable including an insulated sheath, a main core surrounded with the insulated sheath, and a probe contact portion exposed from the insulated sheath and extended from the main core so as to be in contact with the signal probe, wherein the main core comprises a core reinforcer sheathed on the probe contact portion.

The test device according to the first aspect may further include a core reinforcer sheathed on the probe contact portion.

The core reinforcer may be formed by applying and hardening liquid resin.

the core reinforcer may include an insulating material, and be partially removed from the probe contact portion to be in contact with the signal probe.

The test device may further include a cable supporter which includes a cable accommodating hole to accommodate the coaxial cable, and a cable supporting block coupled to the conductive block while aligning the probe hole with the cable accommodating hole.

The probe contact portion may be grinded flat in a portion to be in contact with the signal probe.

The portion grinded flat may include a plating layer plated with a conductive material.

The probe contact portion may include a plating layer of which a portion to be in contact with the signal probe is plated with a conductive material.

The plating layer may be plated more largely than the area of the portion grinded flat.

The plating layer may be plated more largely than the cross-sectional area of the main core.

The probe contact portion may be bent one or more times.

The contact portion may be coupled to the linear extension portion.

The core reinforcer may include a conductive tube configured to accommodate the probe contact portion.

The core reinforcer may include a conductive contact head provided at one end of the tube so as to be in contact with the probe.

Advantageous Effects

The test device can test an object having a fine pitch between contact points by making a signal probe be in direct contact with a core of a coaxial cable.

The test device can improve in contact reliability of a test based on direct contact between a signal probe and a core of a coaxial cable.

DESCRIPTION OF DRAWINGS

The above and/or other aspects will become apparent and more readily appreciated from the following description of exemplary embodiments, taken in conjunction with the accompanying drawings, in which:

FIG. 5 is a partially enlarged cross-sectional view showing a detailed coupling state between a signal probe and a coaxial cable;

FIGS. 6 and 7 are a plan view and a perspective view showing arrangement of coaxial cables according to a second embodiment of the disclosure;

FIG. 8 is a cross-sectional view of a test device according to a third embodiment of the disclosure;

FIG. 9 is a perspective view showing a structure of a coaxial cable according to a fourth embodiment of the disclosure;

FIG. 10 is a perspective view showing a structure of a coaxial cable according to a fifth embodiment of the disclosure;

FIG. 11 is a perspective view showing a structure of a coaxial cable according to a sixth embodiment of the disclosure;

FIG. 12 is a perspective view showing a structure of a coaxial cable according to a seventh embodiment of the disclosure.

BEST MODE

Below, a test device 1 according to the present disclosure will be described in detail with reference to the accompanying drawings.

Figure 1:
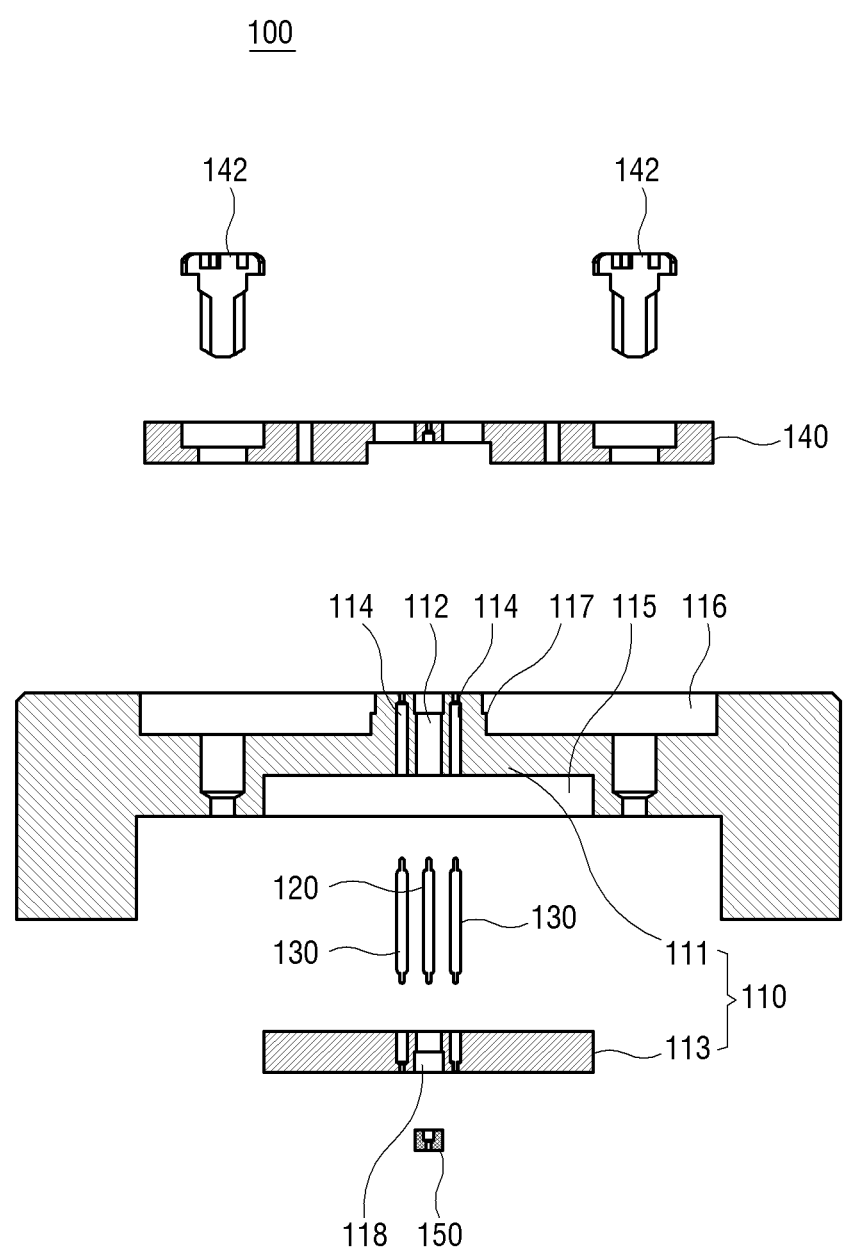
FIG. 1 is an exploded cross-sectional view of a test socket according to a first embodiment of the disclosure.

FIG. 1 is an exploded sectional view of a test socket 100 according to a first embodiment of the disclosure, FIGS. 2 to 5 are a plan view, a bottom perspective view, an exploded perspective view, and a partially enlarged cross-sectional view of a test device 1 according to a first embodiment of the disclosure. As shown therein, the test device 1 includes a test socket 100, a coaxial cable 200, and a cable supporter 300.

The test socket 100 includes a conductive block 110 having at least one signal probe hole 112 and at least one ground probe hole 114, a signal probe 120 contactless-accommodated in the signal probe hole 112, a ground probe 130 contact-accommodated in the ground probe hole 114, an upper supporting member 140 supporting the top of the signal probe 120, and a lower supporting member 150 supporting the bottom of the signal probe 120.

The conductive block 110 includes an upper conductive block 111 and a lower conductive block 113.

Figure 2:
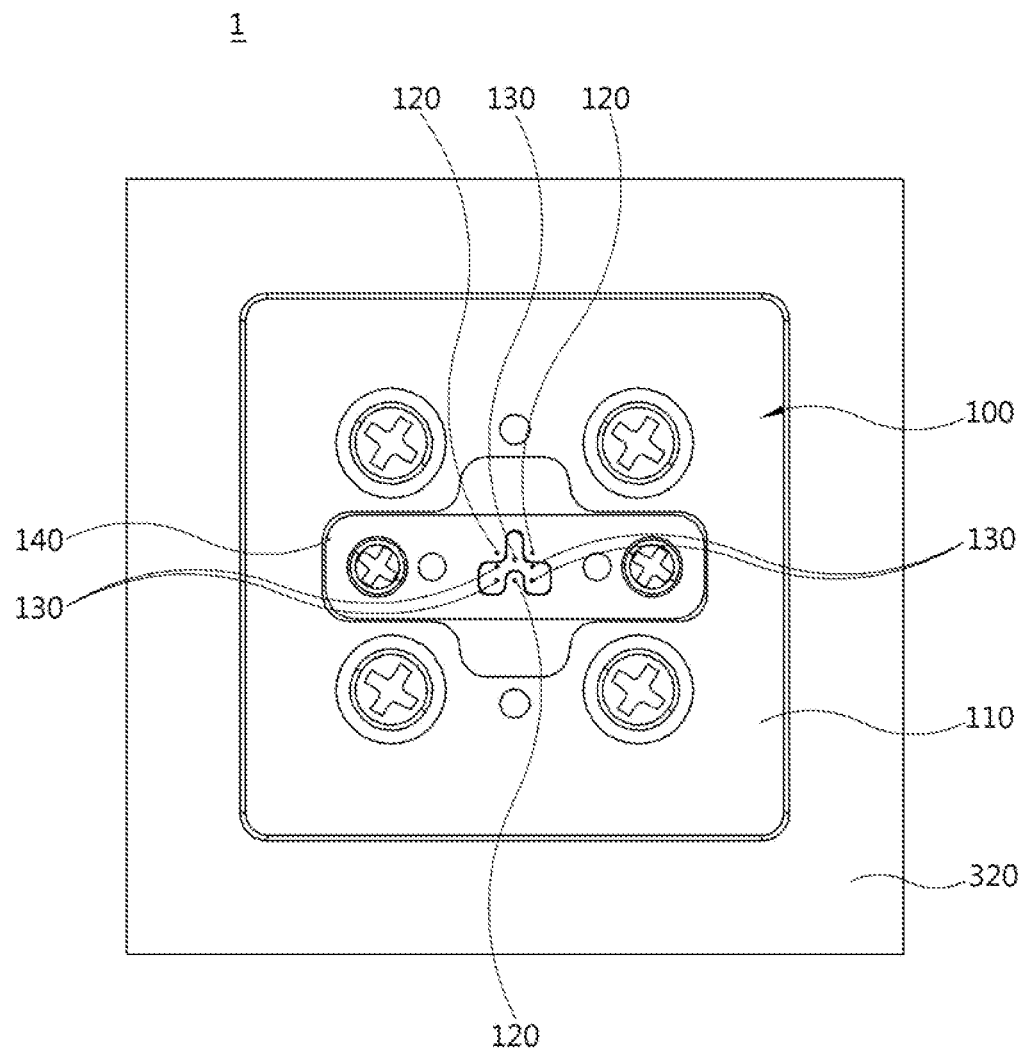
FIG. 2 is a plan view of the test device of the disclosure.
Figure 3:
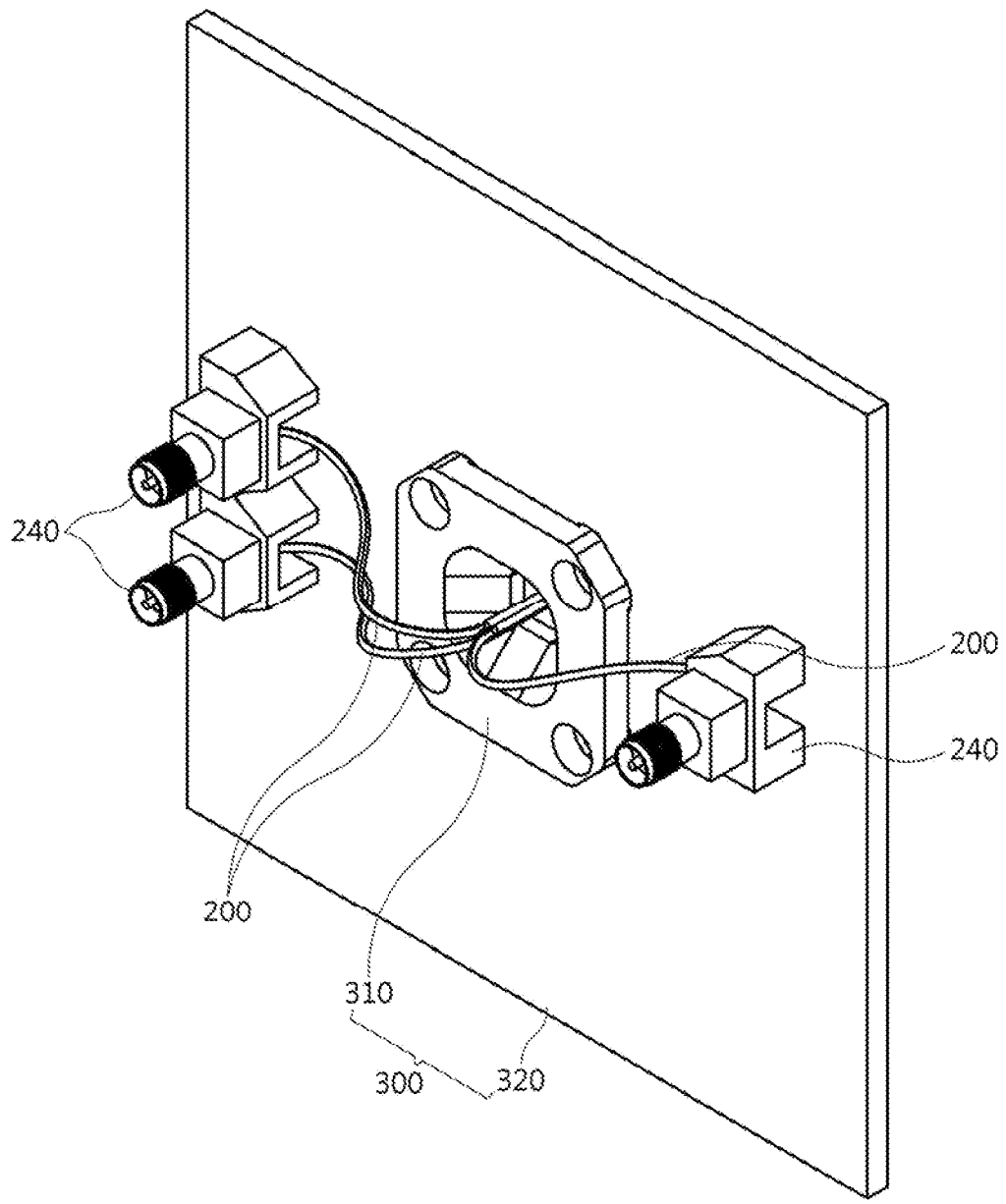
FIG. 3 is a bottom perspective view of the test device of the disclosure.
Figure 4:
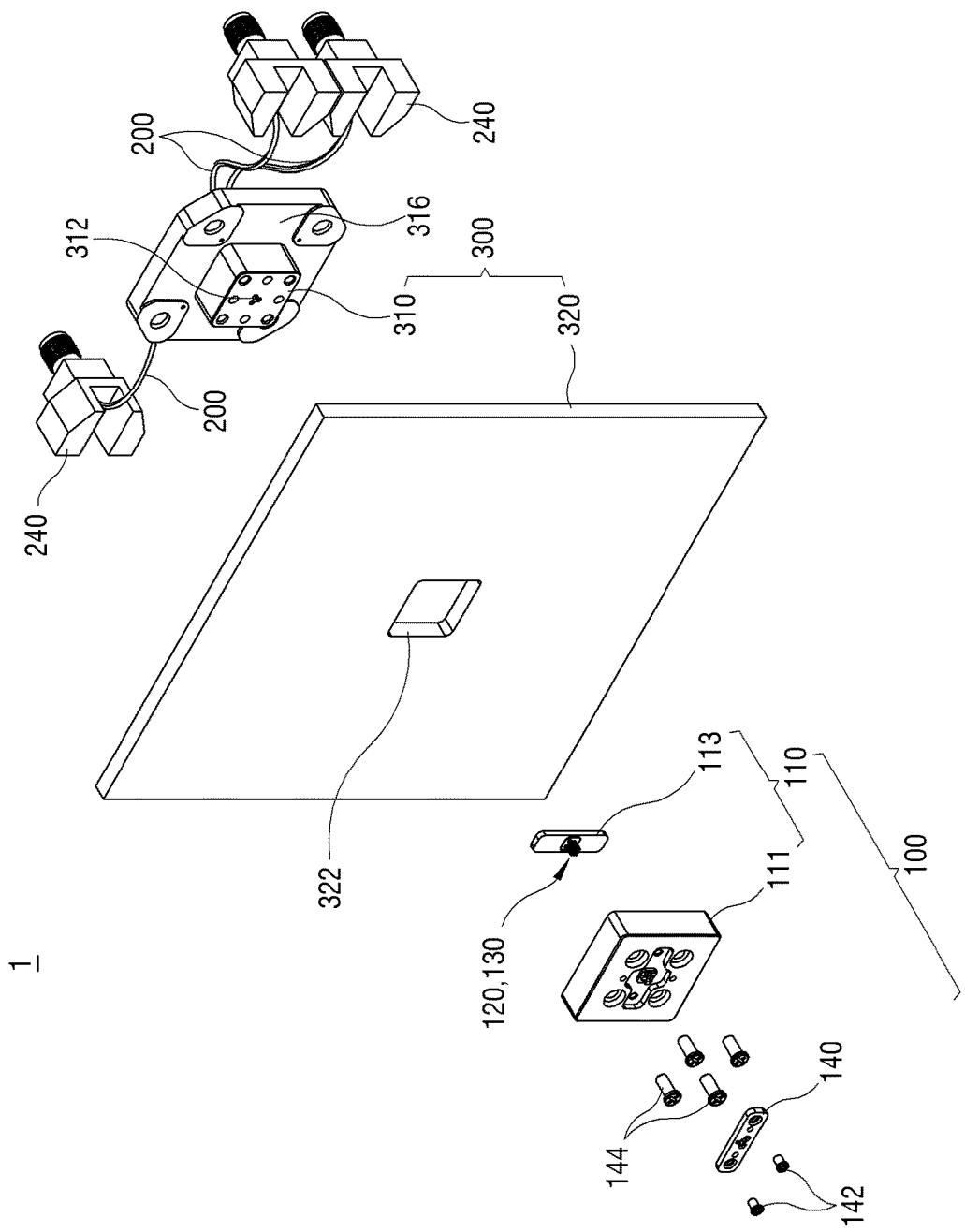
FIG. 4 is an exploded perspective view of the test device of the disclosure.

The upper conductive block 111 includes an upper supporting member accommodating groove 116 to accommodate the upper supporting member 140 on the top of the conductive block 110. The upper supporting member accommodating groove 116 includes a shield island 117 protruding at the center thereof. The shield island 117 blocks noise among the signal probes 120 supported in the non-conductive upper supporting member 140. In other words, the shield island 117 is interposed among three signal probes 120. As shown in FIG. 2, five ground probes 130 partially protrude as supported in the shield island 117, and three signal probes 120 partially protrude as supported in the upper supporting member 140.

The lower conductive block 113 is accommodated in a lower conductive block accommodating groove 115 of the upper conductive block 111. The signal probe hole 112 and the ground probe hole 114 are formed communicating with the upper conductive block 111 and the lower conductive block 113. In result, the signal probe 120 and the ground probe 130 are contactless-inserted and contact-inserted in the signal probe hole 112 and the ground probe hole 114 formed communicating with the upper conductive block 111 and the lower conductive block 113, respectively. In this case, both ends of each of the signal probe 120 and the ground probe 130 partially protrude from the top and bottom of the conductive block 110. The lower conductive block 113 is formed with a lower supporting member accommodating groove 118 to accommodate the lower supporting member 150 around the signal probe hole 112 on the bottom thereof.

The signal probe 120 includes an upper end to be in contact with a contact point of an object to be tested, and a lower end to be in contact with a probe contact portion 212 of the coaxial cable 200. The signal probe 120 receives a test signal through the probe contact portion 212 of the coaxial cable 200. The signal probe 120 may be embodied as a type of retractable pogo pin. The signal probe 120 includes a barrel (not shown), upper and lower plungers (not shown) partially inserted in both ends of the barrel, and a spring (not shown) placed between the upper and lower plungers inside the barrel. At least one of the upper and lower plungers is slidably and movably inserted to compress the spring inside the barrel.

The ground probe 130 includes an upper end to be in contact with a ground terminal of an object to be tested (not shown), and a lower end to be in contact with the cable supporter 300. The ground probe 130 receives a ground signal from the object to be tested. The ground probe 130 may be embodied as a type of retractable pogo pin. The ground probe 130 includes a barrel (not shown), upper and lower plungers (not shown) partially inserted in both ends of the barrel, and a spring (not shown) placed between the upper and lower plungers inside the barrel. At least one of the upper and lower plungers is slidably and movably inserted to compress the spring inside the barrel.

The upper supporting member 140 is fastened to the upper conductive block 111 by a first screw 142 as accommodated in the upper supporting member accommodating groove 116 to support the upper end of the signal probe 120. The signal probe 120 is inserted in the signal probe hole 112 of the conductive block 110 as floating without contact to prevent a short-circuit. To this end, the insulated upper supporting member 140 supports the upper end of the signal probe 120.

Likewise, the lower supporting member 150 is accommodated in the lower supporting member accommodating groove 118 to support the lower end of the signal probe 120. The signal probe 120 is inserted in the signal probe hole 112 of the conductive block 110 as floating without contact to prevent a short-circuit. To this end, the insulated lower supporting member 150 supports the lower end of the signal probe 120.

The coaxial cable 200 includes a main core 210 at the center thereof to transmit a signal, an insulated sheath 230 made of an insulating material and surrounding the main core 210, the probe contact portion 212 extended from the main core 210 as a single body with the insulated sheath 230 removed, and a core reinforcer 214 sheathed on the probe contact portion 212. The core reinforcer 214 may be formed by applying, for example, liquid epoxy resin to the probe contact portion 212 and then hardening the resin. The liquid epoxy resin may be applied to the probe contact portion 212 before or after being accommodated in a cable supporting block 310 (to be described later). For contact with the signal probe 120, the probe contact portion 212 of the coaxial cable 200 may be subjected to grinding or be covered with a mask before applying the liquid epoxy resin thereto. The core reinforcer 214 may be previously manufactured and then fitted to the probe contact portion 212.

A first end of the coaxial cable 200 to be in contact with the signal probe 120 is supported by the cable supporting block 310 to be described later, and the second end is supported by an insulating substrate 320 spaced apart from the first end. The coaxial cable 200 includes a signal connector 240 to receive the test signal from the outside. The signal connector 240 is mounted to the insulating substrate 320.

FIGS. 6 and 7 are a plan view and a perspective view showing arrangement of coaxial cables 200 according to a second embodiment of the disclosure. Because the coaxial cable 200 includes the insulated sheath 230 having a large diameter, the axis X of the coaxial cable 200 is spaced part from the axis Y of the signal probe 120.

The coaxial cable 200 includes the main core 210 at the center thereof to transmit a signal, the insulated sheath 230 made of an insulating material and surrounding the main core 210, the probe contact portion 212 extended from the main core 210 as a single body with the insulated sheath 230 removed, and the core reinforcer 214 sheathed on the probe contact portion 212.

The probe contact portion 212 includes a linear extension portion 215 extended along the axis X of the coaxial cable 200, and a contact portion 216 bent from the linear extension portion 215 toward the axis Y of the signal probe 120. Alternatively, the probe contact portion 212 may be bent one or more times in various forms. Further, the probe contact portion 212 may be obliquely extended toward the end of the signal probe 120. The top of the contact portion 216 is exposed with the core reinforcer 214 removed. The signal probe 120 contacts the exposed top of the contact portion 216. The top of the contact portion 216 may be grinded after entirely coating the probe contact portion 212 with the core reinforcer 214.

The first end of the coaxial cable 200 to be in contact with the signal probe 120 is supported by the cable supporting block 310 to be described later, and the second end is supported by the insulating substrate 320 spaced apart from the first end. The coaxial cable 200 includes the signal connector 240 to receive the test signal from the outside. The signal connector 240 is mounted to the insulating substrate 320.

The cable supporter 300 includes the cable supporting block 310 having a cable accommodating hole 312 to accommodate the coaxial cable 200, and the insulating substrate 320 mounted with the test socket 100.

The cable supporting block 310 includes a plurality of cable accommodating holes 312 at positions corresponding to the signal probe holes 112 of the lower conductive block 113. The cable supporting block 310 may be made of conductive metal. The cable supporting block 310 is fastened to the conductive block 110 by a second screw 144 as being inserted in a through hole 322 of the insulating substrate 320. The cable supporting block 310 includes a cable supporting recess recessed on an opposite side to a portion to be in contact with the conductive block 110, and an extension plate 316 extended horizontally. The coaxial cable 200 is fastened by filling the cable supporting recess with an adhesive (glue) 315 in a state that the coaxial cable 200 is being inserted in the cable accommodating hole 312 in the cable supporting recess. The extension plate 316 is in contact with the rear side of the insulating substrate 320 and, together with the test socket 100, supports the insulating substrate 320.

The insulating substrate 320 includes one side to which the test socket 100 is mounted, and the rear side to which the second ends of the coaxial cables 200 are attached as being separated from one another to block noise. The insulating substrate 320 includes the through hole 322 to make the cable supporting block 310 pass therethrough and accommodated therein.

FIG. 8 is a cross-sectional view of a test device 2 according to a third embodiment of the disclosure. The same numerals refer to the same elements as those of the test device 1 according to the first embodiment shown in FIGS. 1 to 5, and only differences will be described.

As shown therein, the test device 2 includes the test socket 100, the coaxial cable 200, and the cable supporter 300.

The cable supporter 300 excludes the insulating substrate 320, and the signal connector 240 is coupled to the extension plate 316 instead of the insulating substrate 320.

FIG. 9 is a perspective view showing a structure of a coaxial cable 200 according to a fourth embodiment of the disclosure.

The coaxial cable 200 includes the probe contact portion 212 with the insulated sheath 230 removed, and the core reinforcer 214 sheathed on the probe contact portion 212.

The probe contact portion 212 includes the linear extension portion 215 extended along the axis X of the coaxial cable 200, and the contact portion 216 bent from the linear extension portion 215 toward the axis Y of the signal probe 120. The top of the contact portion 216 is exposed with the core reinforcer 214 removed. Further, the top of the contact portion 216 may include a flat portion 217 grinded flat, and a plating layer 218 formed in a portion of the flat portion 217 to be in contact with the signal probe 120 and plated with a conductive material, for example, gold, platinum, silver, etc. Of course, the top of the contact portion 216 may include only the plating layer 218 without being grinded. In this case, the plating layer 218 may include a flat portion. The grinding or plating for the top of the contact portion 216 may be carried out after forming the core reinforcer 214, or may be carried out before forming the core reinforcer 214.

FIG. 10 is a perspective view showing a structure of a coaxial cable 200 according to a fifth embodiment of the disclosure.

The coaxial cable 200 includes the probe contact portion 212 with the insulated sheath 230 removed, and the core reinforcer 214 sheathed on the probe contact portion 212.

The probe contact portion 212 includes the linear extension portion 215 extended along the axis X of the coaxial cable 200, and the contact portion 216 bent from the linear extension portion 215 toward the axis Y of the signal probe 120. The top of the contact portion 216 is exposed with the core reinforcer 214 removed. Further, the contact portion 216 may include an additional contact portion 219 additionally bent backward, and the plating layer 218 formed in an additionally bending portion and plated with a conductive material, for example, gold, platinum, silver, etc. The plating for the top of the contact portion 216 may be carried out after forming the core reinforcer 214, or may be carried out before forming the core reinforcer 214. Of course, the plating layer 218 may be provided in a state that the top of the contact portion 216 is grinded flat.

FIG. 11 is a perspective view showing a structure of a coaxial cable 200 according to a sixth embodiment of the disclosure.

The coaxial cable 200 includes the probe contact portion 212 with the insulated sheath 230 removed, and the core reinforcer 214 sheathed on the probe contact portion 212.

The probe contact portion 212 includes the linear extension portion 215 extended along the axis X of the coaxial cable 200, and the contact portion 216 bent from the linear extension portion 215 toward the axis Y of the signal probe 120. The contact portion 216 includes a coupling head 216-1 formed with a coupling hole 216-2 at the center thereof, and a contact extension portion 216-3 extended toward the axis Y of the signal probe 120. The contact portion 216 is coupled by inserting the end of the linear extension portion 215 in the coupling hole 216-2. The linear extension portion 215 inserted in the coupling hole 216-2 may be fastened by fitting, soldering, or insulating epoxy or the like adhesive.

FIG. 12 is a perspective view showing a structure of a coaxial cable 200 according to a seventh embodiment of the disclosure.

The coaxial cable 200 includes the probe contact portion 212 with the insulated sheath 230 removed, and the core reinforcer 214 sheathed on the probe contact portion 212.

The probe contact portion 212 is extended along the axis X of the coaxial cable 200. The core reinforcer 214 may be made of a conductive material. The core reinforcer 214 may include a tube 214-1 to accommodate the probe contact portion 212, and a contact head 214-2 shaped like a flange extended in a radial direction of the tube 214-1. Here, the conductive core reinforcer 214 may serve for both the reinforcement and contact terminal of the core.

In a test device according to the disclosure in which a core of a coaxial cable is in direct contact with a signal probe, a probe contact portion with an insulated sheath removed is reinforced, thereby minimizing a deformation of a core contact portion and improving contact reliability.

Further, in a test device in which a core of a coaxial cable is in direct contact with a signal probe, a core contact portion is bent so as to easily test even an object having a fine pitch between contact points to be tested.

Although the present disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the present disclosure has to be defined by not the exemplary embodiments but appended claims and the equivalents.

The invention claimed is:

1. A test device for testing an electric characteristic of an object to be tested, the test device comprising:
   a block comprising a probe hole;
   a probe supported in the probe hole and retractably configured to connect a first contact point and a second contact point; and
   a coaxial cable comprising an insulated sheath, a main core surrounded with the insulated sheath, and a probe contact portion exposed from the insulated sheath and extended from the main core so as to be in contact with the probe, wherein
   an axis of the probe is spaced apart from an axis of the main core of the coaxial cable, and
   the probe contact portion is extended radially from the axis of the main core toward the axis of the probe.

2. The test device according to claim 1, further comprising a core reinforcer sheathed on the probe contact portion.

3. The test device according to claim 1, wherein the probe contact portion is bent one or more times.

4. The test device according to claim 1, wherein the probe contact portion comprises
   a linear extension portion extended along an axis of the coaxial cable; and
   a contact portion extended radially from the linear extension portion toward an axis of the probe.

5. The test device according to claim 4, wherein the contact portion is coupled to the linear extension portion.

6. A test device for testing an electric characteristic of an object to be tested, the test device comprising:
   a block comprising a probe hole;
   a plurality of probes supported in the probe hole and retractably configured to connect a first contact point and a second contact point;
   a coaxial cable comprising an insulated sheath, a main core surrounded with the insulated sheath, and a probe contact portion exposed from the insulated sheath and extended from the main core toward the probe so as to be in contact with the probe; and
   a core reinforcer sheathed on the probe contact portion, wherein the core reinforcer is formed by applying and hardening liquid resin.

7. The test device according to claim 6, wherein the core reinforcer comprises a conductive material.

8. The test device according to claim 6, wherein the core reinforcer comprises an insulating material, and is partially removed from the probe contact portion to be in contact with the probe.

9. The test device according to claim 6, further comprising a cable supporter which comprises a cable accommodating hole to accommodate the coaxial cable, and a cable supporting block coupled to the conductive block while aligning the probe hole with the cable accommodating hole.

10. The test device according to claim 6, wherein the probe contact portion comprises a plating layer of which a portion to be in contact with the probe is plated with a conductive material.

11. The test device according to claim 10, wherein the plating layer is plated more largely than a cross-sectional area of the main core.

12. The test device according to claim 6, wherein the core reinforcer comprises a conductive tube configured to accommodate the probe contact portion.

13. The test device according to claim 12, wherein the core reinforcer comprises a conductive contact head provided at one end of the tube so as to be in contact with the probe.

14. A test device for testing an electric characteristic of an object to be tested, the test device comprising:
- a block comprising a probe hole;
- a plurality of probes supported in the probe hole and retractably configured to connect a first contact point and a second contact point;
- a coaxial cable comprising an insulated sheath, a main core surrounded with the insulated sheath, and a probe contact portion exposed from the insulated sheath and extended from the main core toward the probe so as to be in contact with the probe; and
- a core reinforcer sheathed on the probe contact portion,
- wherein the probe contact portion comprises a flat portion of which a portion to be in contact with the probe is grinded flat.

15. The test device according to claim 14, wherein the flat portion comprises a plating layer plated with a conductive material.

16. The test device according to claim 15, wherein the plating layer is plated more largely than an area of the flat portion.

* * * * *